United States Patent
Zihir et al.

(10) Patent No.: US 10,063,274 B1
(45) Date of Patent: Aug. 28, 2018

(54) METHOD TO BUILD ASYMMETRICAL TRANSMIT/RECEIVE SWITCH WITH 90 DEGREES IMPEDANCE TRANSFORMATION SECTION

(71) Applicant: Integrated Device Technology, Inc., San Jose, CA (US)

(72) Inventors: Samet Zihir, San Diego, CA (US); Naveen Krishna Yanduru, San Diego, CA (US); Tumay Kanar, San Diego, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/825,736

(22) Filed: Nov. 29, 2017

Related U.S. Application Data

(60) Provisional application No. 62/559,875, filed on Sep. 18, 2017, provisional application No. 62/560,173, filed on Sep. 18, 2017.

(51) Int. Cl.
| | |
|---|---|
| *H04B 1/44* | (2006.01) |
| *H03F 1/56* | (2006.01) |
| *H03F 3/19* | (2006.01) |
| *H03G 3/30* | (2006.01) |
| *H03F 3/24* | (2006.01) |

(52) U.S. Cl.
CPC .............. *H04B 1/44* (2013.01); *H03F 1/565* (2013.01); *H03F 3/19* (2013.01); *H03F 3/245* (2013.01); *H03G 3/3042* (2013.01); *H03F 2200/294* (2013.01); *H03F 2200/387* (2013.01); *H03F 2200/451* (2013.01)

(58) Field of Classification Search
CPC .......... H04B 1/48; H04B 1/44; H04B 1/0458; H04B 1/18; H04B 1/04; H04B 1/525; H04B 2001/0491; H04B 7/12; H04B 5/02; H04B 1/005; H04B 1/006
USPC .......................................................... 455/78
See application file for complete search history.

(56) References Cited

U.S. PATENT DOCUMENTS

| | | | |
|---|---|---|---|
| 2013/0331043 A1* | 12/2013 | Perumana .............. | H04B 1/525 455/78 |
| 2014/0179241 A1* | 6/2014 | Aggarwal ............... | H03H 7/38 455/83 |
| 2017/0194918 A1* | 7/2017 | Wallis .................... | H03F 1/565 |

* cited by examiner

*Primary Examiner* — Ajibola Akinyemi
(74) *Attorney, Agent, or Firm* — Christopher P. Maiorana, PC

(57) ABSTRACT

An apparatus includes an input port, an output port, a common port, a first impedance matching network, a second impedance matching network, a first switch circuit, and a second switch circuit. The first impedance matching network may be coupled between the input port and the common port. The second impedance matching network may be coupled between the common port and the output port. The first switch circuit may be coupled between the input port and a circuit ground potential. The second switch circuit may be coupled between the output port and the circuit ground potential. The first and the second impedance matching networks are asymmetrical.

20 Claims, 7 Drawing Sheets

METHOD TO BUILD ASYMMETRICAL TRANSMIT/RECEIVE SWITCH WITH 90 DEGREES IMPEDANCE TRANSFORMATION SECTION

This application relates to U.S. Provisional Application No. 62/559,875, filed Sep. 18, 2017, and U.S. Provisional Application No. 62/560,173, filed Sep. 18, 2017, which are hereby incorporated by reference in their entirety.

FIELD OF THE INVENTION

The invention relates to wireless communications generally and, more particularly, to a method and/or apparatus for implementing an asymmetrical transmit/receive (T/R) switch with a 90 degrees impedance transformation section.

BACKGROUND

Conventional radio frequency (RF) transceivers include either a circulator or a transmit/receive (T/R) switch to selectively couple an antenna port to either a transmit chain or a receive chain of the transceiver. Conceptually, the transmit/receive (T/R) switch is a single-pole double-throw (SPDT) switch that (i) couples a first radio frequency (RF) port (e.g., a TX port) to a common RF port (e.g., a TRX port) and isolates the common RF port from a second radio frequency (RF) port (e.g., an RX port) in a transmit mode, and (ii) couples the common RF port to the second radio frequency (RF) port and isolates the first RF port from the common RF port in a receive mode. In general, the first RF port is connected to a RF signal path of the transmit chain, the second RF port is connected to a RF signal path of the receive chain, and the common RF port is connected to an antenna. Conventional transmit/receive (T/R) switches utilize a symmetrical structure that provides the same impedance (e.g., $Z_0$) on the TX port, the RX port, and the TRX port. The symmetrical structure can result in larger voltage swings at the transmitter (TX) port.

It would be desirable to implement an asymmetrical transmit/receive (T/R) switch with a 90 degrees impedance transformation section.

SUMMARY

The invention concerns an apparatus comprising an input port, an output port, a common port, a first impedance matching network, a second impedance matching network, a first switch circuit, and a second switch circuit. The first impedance matching network may be coupled between the input port and the common port. The second impedance matching network may be coupled between the common port and the output port. The first switch circuit may be coupled between the input port and a circuit ground potential. The second switch circuit may be coupled between the output port and the circuit ground potential. The first and the second impedance matching networks are asymmetrical.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing an asymmetrical transmit/receive switch with a 90 degrees impedance transformation section that may (i) be implemented between an output of a transceiver transmit chain, an input of a transceiver receive chain, and an antenna port, (ii) have a transmit port impedance that is lower than either receive port or common port impedances to improve linearity, (iii) provide lower voltage swing, (iv) include a voltage boosting capacitor to prevent unwanted turn on of transmit port shunt switch, (v) utilize an inductor on a control terminal of a receive port shunt switch to improve insertion loss, (vi) be implemented using a variety of semiconductor technologies, and/or (vii) be implemented as one or more integrated circuits.

Figure 1:
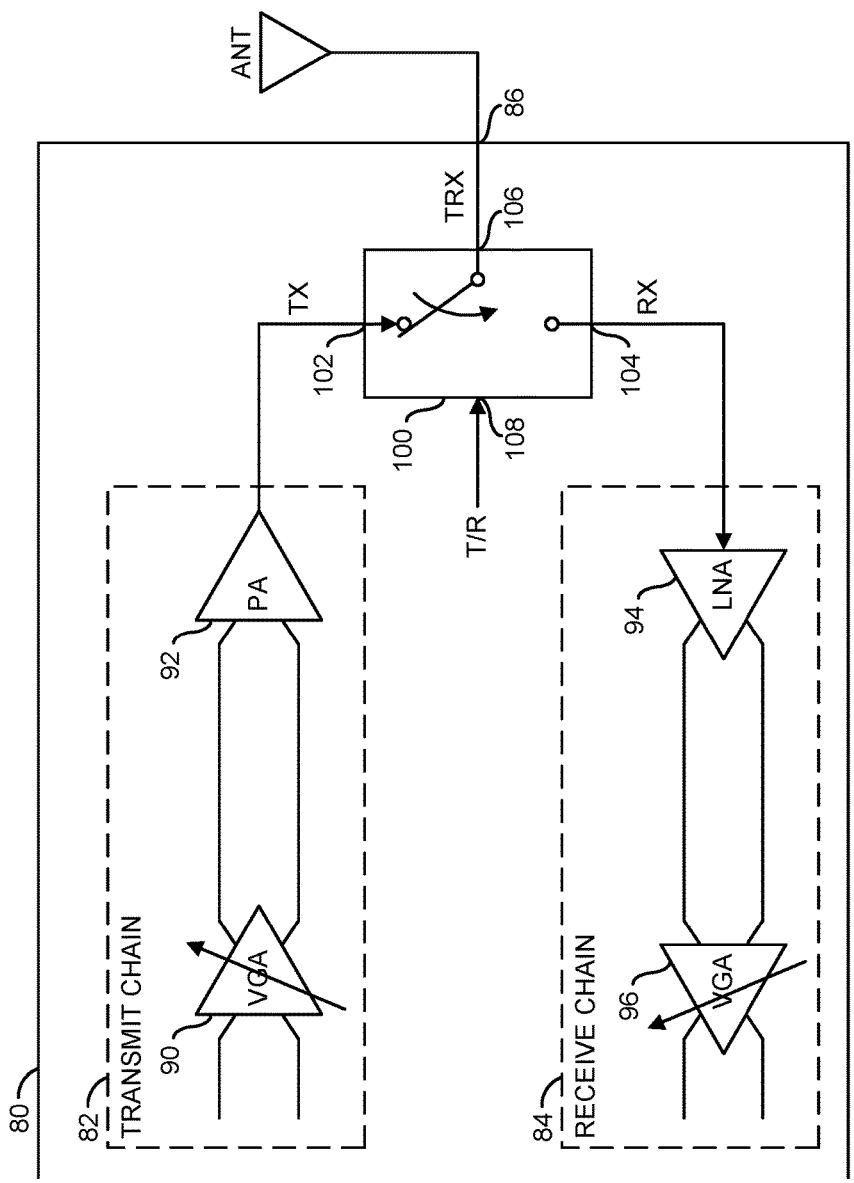
FIG. 1 is a diagram illustrating an example application of an asymmetrical transmit/receive (T/R) switch in accordance with an embodiment of the invention.

Referring to FIG. 1, a block diagram of a circuit 80 is shown illustrating an example application of an asymmetrical T/R switch in accordance with an embodiment of the invention. In an example embodiment, the circuit 80 may implement a transceiver. A transceiver is capable of both transmitting and receiving signals of a communication channel. In various embodiments, the circuit 80 may be capable of transmitting and receiving radio frequency (RF), microwave, and/or millimeter-wave signals. In various embodiments, the circuit 80 may be representative of transceiver circuits utilized in applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and portable handheld devices (UEs).

In an example, the circuit 80 may comprise a block (or circuit) 82, a block (or circuit) 84, and an antenna port 86. In an example, the circuit 82 may be implemented as a stand alone transmitter circuit. In another example, the circuit 82 may be implemented as a transmit chain of a transceiver integrated circuit. In an example, the circuit 84 may be implemented as a stand alone receiver circuit. In another example, the circuit 84 may be implemented as a receive chain of the transceiver integrated circuit embodying the transmit chain 82.

In an example, the transmitter or transmit chain 82 may comprise a first (input) amplifier 90 and a second (output) amplifier 92. In an example, the amplifier 90 may be implemented as a variable gain amplifier (VGA) and the amplifier 92 may be implemented as a power amplifier (PA). The VGA amplifier 90 may be coupled, directly or indirectly through other components, to the power amplifier 92. In various embodiments, the circuit 82 may further comprise one or more of additional components (e.g., RF amplifiers, IF amplifiers, RF mixers, digital step attenuators (DSAs), broadband modulators, wideband voltage variable attenuators, etc.), not shown.

In an example, the receive chain 84 may comprise a first (input) amplifier 94 and a second (output) amplifier 96. In an example, the amplifier 94 may be implemented as a low noise amplifier (LNA) and the amplifier 96 may be implemented as a variable gain amplifier (VGA). The LNA 94 may be coupled, directly or indirectly through other components, to the VGA 96. In various embodiments, the circuit 84 may further comprise one or more of additional components (e.g., filters, limiters, RF amplifiers, IF amplifiers, RF mixers, digital step attenuators (DSAs), broadband demodulators, wideband voltage variable attenuators, etc.), not shown.

In an example, the transmitter or transmit chain 82, the receiver or receive chain 84, and the antenna port 86 may be coupled together via a block (or circuit) 100. The circuit 100 generally implements an asymmetrical transmit/receive (T/R) switch in accordance with an example embodiment of the present invention. In an example, the circuit 100 may be implemented as a stand alone integrated circuit. In another example, the circuit 100 may be integrated, along with the transmit chain 82 and the receive chain 84, within a transceiver integrated circuit.

In an example, the circuit 100 may have an first (input) port 102, a second (output) port 104, a third (common) port 106, and a control input 108. The first port may be coupled to an output of the transmitter or transmit chain 82. The second port 104 that may be coupled to an input of the receiver or receive chain 84. The common port 106 may be coupled to the antenna port 86. The control input 108 may receive a signal (e.g., T/R). The signal T/R may implement a control signal for switching between a transmit mode where a signal is directed from the first (TX) port 102 to the common (TRX) port 106 and a receive mode where a signal is directed from the common (TRX) port 106 to the second (RX) port 104. In an example, the signal T/R may be implemented as summarized in the following TABLE 1:

TABLE 1

| T/R | TX to TRX | TRX to RX |
|---|---|---|
| LOW | OFF (isolated) | ON |
| HIGH | ON | OFF (isolated) |

The signal T/R may be presented either directly to the input 108 or through a conditioning circuit (e.g., where a clean control signal cannot be guaranteed due to overshoot, undershoot, ringing, etc.).

Figure 2:
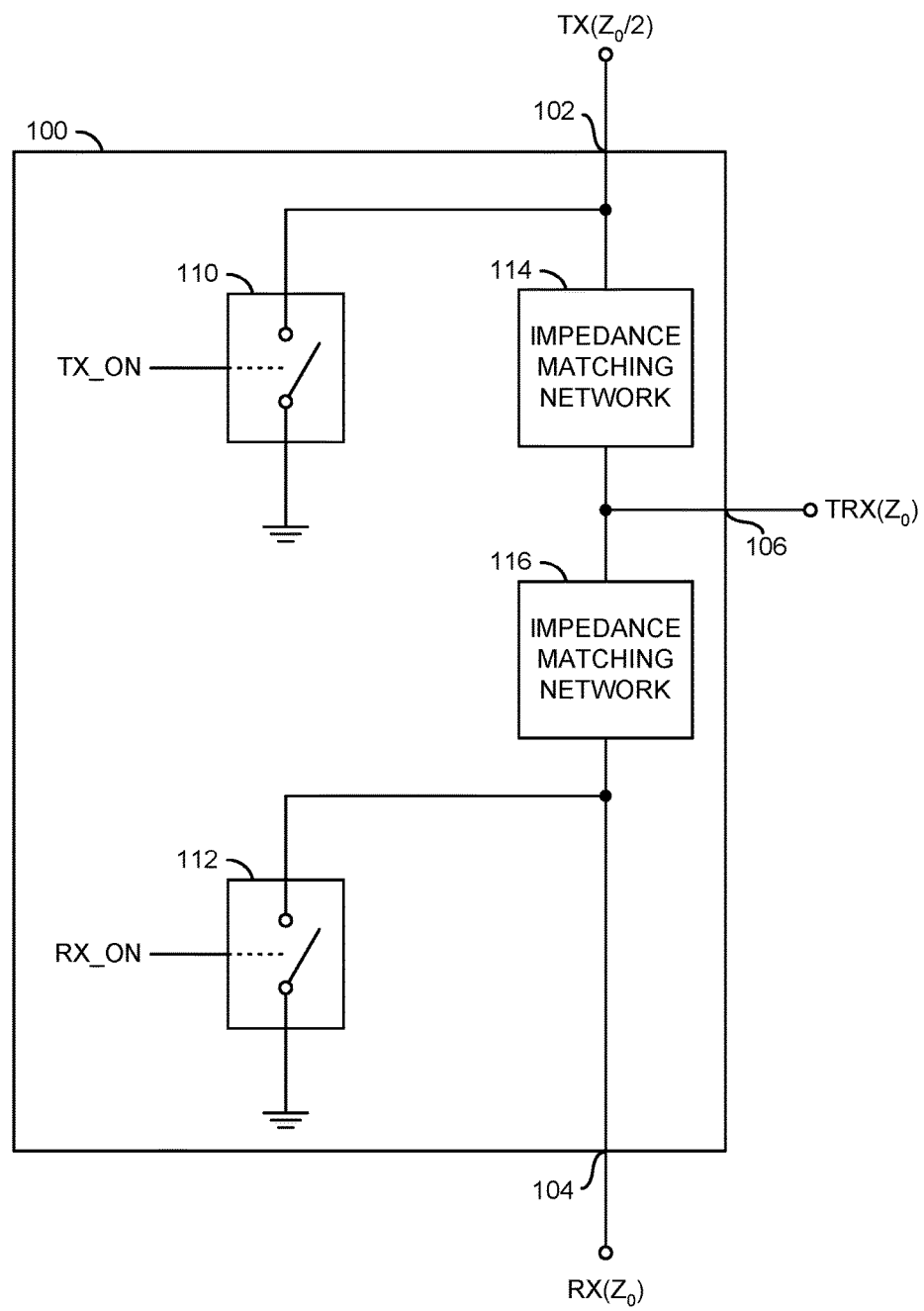
FIG. 2 is a diagram illustrating an example asymmetrical T/R switch in accordance with an example embodiment of the invention.

Referring to FIG. 2, a block diagram of the circuit 100 is shown illustrating an example asymmetrical T/R switch in accordance with an example embodiment of the invention. In an example, the circuit 100 may implement a single-pole double-throw (SPDT) radio frequency (RF) switch. However, embodiments with higher numbers of poles and/or throws may be implemented accordingly to meet design criteria of particular applications. In various embodiments, the circuit 100 may support a wide variety of radio frequency (RF), microwave, and/or millimeter-wave applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and portable handheld devices (UEs). In various embodiments, the circuit 100 may be configured to cover frequencies ranging from 100 MHz to over 100 GHz. In an example, the circuit 100 may be configured (e.g., optimized) for use at particular frequencies (e.g., a 39 GHz 5G application, etc.).

In various embodiments, the circuit 100 may comprise a block (or circuit) 110, a block (or circuit) 112, a block (or circuit) 114, and a block (or circuit) 116. The circuit 110 may implement a first (input) shunt switch. The circuit 112 may implement a second (output) shunt switch. The circuit 114 may implement a first impedance matching network. The circuit 116 may implement a second impedance matching network. In various embodiments, the impedance matching networks 114 and 116 provide asymmetrical impedances. In various embodiments, the impedance matching network 114 provides a lower impedance than the impedance matching network 116. In an example, the impedance matching network 114 provides an impedance that is a fraction (e.g., ½, ⅓, ¼, etc.) of the impedance of the impedance matching network 116.

The TX port 102 of the circuit 100 may be coupled to a first terminal of the circuit 110 and a first terminal of the circuit 114. A second terminal of the circuit 110 may be coupled to a circuit ground potential (GND). The circuit 110 may have a control input that may receive a first control signal (e.g., TX_ON). The RX port 104 of the circuit 100 may be coupled to a first terminal of the circuit 112 and a first terminal of the circuit 116. A second terminal of the circuit 112 may be coupled to the circuit ground potential (GND). The circuit 112 may have a control input that may receive a second control signal (e.g., RX_ON). The TRX port 106 of the circuit 100 may be coupled to a second terminal of the circuit 114 and a second terminal of the circuit 116. In an example, the circuits 114 and 116 may be configured such that (i) there is a 90 degree delay from either the RX port 104 or the TX port 102 to the TRX port 106, (ii) the RX port 104 and the TRX port 106 have a similar impedance (e.g., $Z_0$), and (iii) the TX port 102 has a lower impedance (e.g., $Z_0/2$, etc.). In an example, the signals TX_ON and RX_ON may be generated in response to the signal T/R at the control input 108 of the circuit 100. In an example, the signals TX_ON and RX_ON may be implemented as summarized in the following TABLE 2:

TABLE 2

| T/R | TX_ON | RX_ON |
|---|---|---|
| LOW | OFF (unasserted) | ON (asserted) |
| HIGH | ON (asserted) | OFF (unasserted) |

When signal T/R is LOW, the switch circuit 110 shorts the TX port 102 to the circuit ground potential GND. Because there is a 90 degrees delay to the TRX port 106, the TX port 102 appears to be open, and the signal flows from the TRX port 106 to the RX port 104. When signal T/R is HIGH, the switch circuit 112 shorts the RX port 104 to the circuit ground potential GND. Because there is a 90 degrees delay to the TRX port 106, the RX port 104 appears to be open, and the signal flows from the TX port 102 to the TRX port 106. Thus, the circuit 100 may be referred to as a reflective asymmetrical, single-pole double-throw RF switch. Because the impedance of the TX port 102 is lower, the asymmetrical structure generally reduces the voltage swings at the TX port 102 (e.g., $P=V^2/R$).

Figure 3:
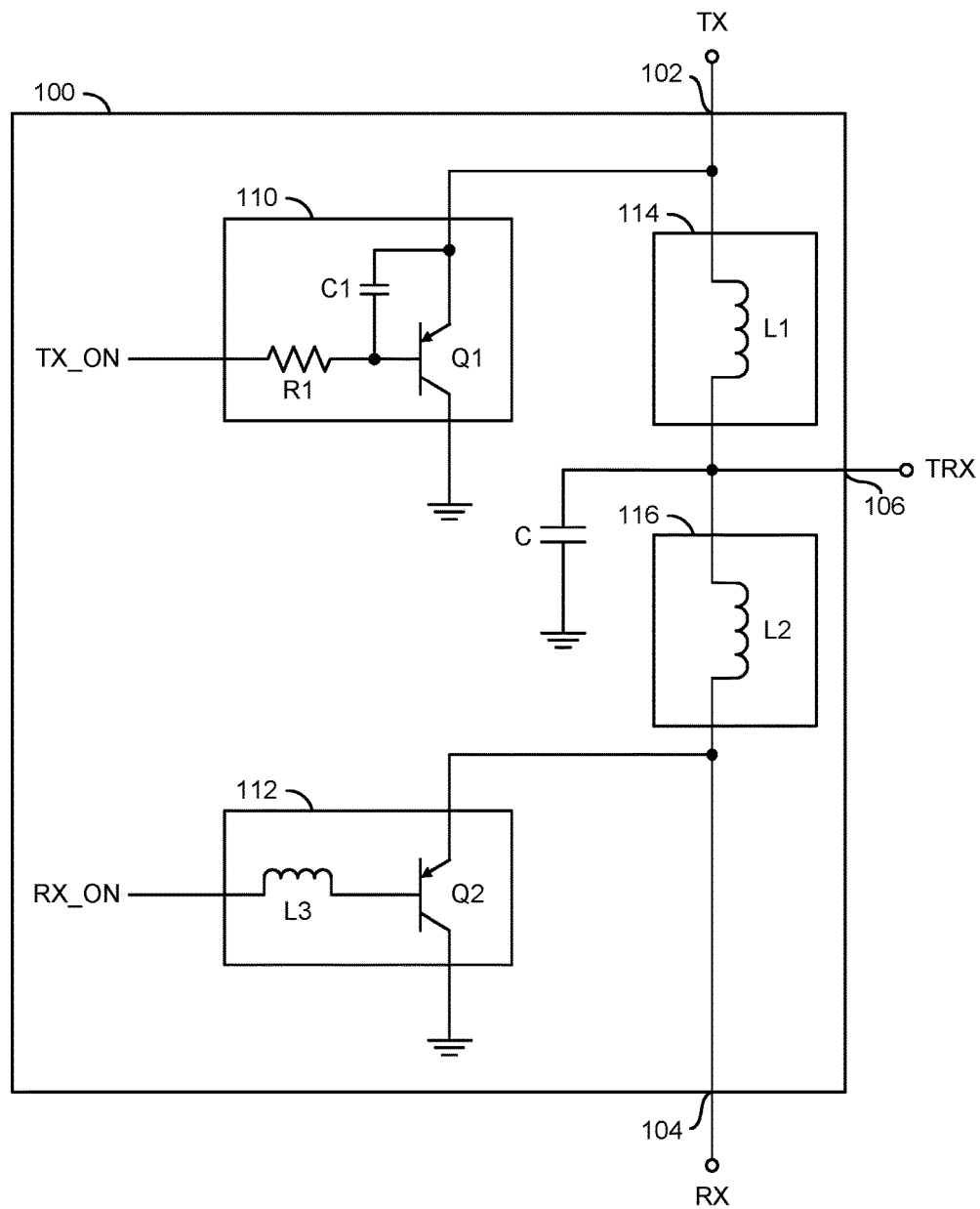
FIG. 3 is a diagram illustrating an example implementation of an asymmetrical T/R switch in accordance with an example embodiment of the invention.

Referring to FIG. 3, a diagram of the circuit 100 is shown illustrating an example implementation of an asymmetrical T/R switch in accordance with an example embodiment of the invention. In an example, the circuit 110 may comprise a transistor Q1, a capacitor C1, and a resistor R1. The circuit 112 may comprise a transistor Q2 and an inductor L3. The impedance matching networks 114 and 116 may be implemented comprising an inductor L1 and an inductor L2, respectively. A capacitor C, which may be shared by the impedance matching networks 114 and 116, may be coupled between the TRX port 106 and the circuit ground potential (GND).

The signal TX_ON may be presented to a first terminal of the resistor R1. A second terminal of the resistor R1 may be connected to a first terminal of the capacitor C1, and a base terminal of the transistor Q1. A second terminal of the capacitor C1 may be connected to an emitter terminal of the transistor Q1, a first terminal of the inductor L1, and the TX port 102 of the circuit 100. A collector terminal of the transistor Q1 may be connected to the circuit ground potential (GND). The signal RX_ON may be presented to a first terminal of the inductor L3. A second terminal of the inductor L3 may be connected to a base terminal of the transistor Q2. An emitter terminal of the transistor Q2 may be connected to the first terminal of the inductor L2 and the RX port 104 of the circuit 100. A collector terminal of the transistor Q2 may be connected to the circuit ground GND. A second terminal of the inductor L1, a second terminal of the inductor L2, and a first terminal of the capacitor C may be connected to the TRX port 106 of the circuit 100. A second terminal of the capacitor C may be connected to the circuit ground potential GND.

In an example, the circuit 100 generally selects between connecting the transmit TX port 102 to the common TRX port 106 or connecting the common TRX port 106 to the receive RX port 104 based on the state of the signals TX_ON and RX_ON. When one of the switching transistors Q1 and Q2 is in a conducting state (or ON), the respective RF port is shorted to the circuit ground potential. However, because of the 90 degrees delay created by the inductors L1 and L2 with respect to the common TRX port 106, the switch leg with the switch circuit turned ON looks like an open circuit and the RF signal flows to/from the other port (e.g., TRX→RX, when TX is shorted to GND).

In various embodiments, the TX port may be designed having a lower input impedance to improve linearity. In an example, the TX port may be designed having an input impedance of 25 ohms. Conventional transmit/receive switches generally have an impedance of 50 ohms, which creates larger voltage swings (e.g., $P=V^2/R$). In embodiments implementing the transistor Q1 as a bipolar junction transistor, the transistor Q1 may incorporate a diode (PN) junction. The diode junction generally has a limited voltage handling capability (e.g., +/−0.8 volts due to the PN junction). By designing with an input impedance of 25 ohms, the voltage swing may be reduced, which improves performance of the switch 110.

The capacitor C1 and the resistor R1 are generally configured to create a voltage swing at the base terminal of the transistor Q1 in response to a voltage level of the TX port 102. When a large signal is applied to the TX port 102, the signal is also applied to the base terminal of the transistor Q1 via the capacitor C1. The base terminal of the transistor Q1 starts following the TX port 102 and an unwanted turn on of the diode junction of the transistor Q1 is prevented. The resistor R1 helps the base terminal of the transistor Q1 to follow the voltage level applied to the TX port 102. In an example, the capacitor C1 may be implemented having a value of 60 fF and the resistor R1 may be implemented having a value of 5K ohms.

In an example, the inductor L3 at the base terminal of the transistor Q2 may be implemented as a 1 nH inductor. The inductor L3 generally improves (e.g., reduces) the insertion loss caused by the switch 100 being placed between the antenna and the input of the receiver or receive chain 84.

In an example of a 26 GHz application, the inductor L1 may be implemented having an inductance of about 180 pH, the inductor L2 may be implemented having an inductance of about 300 pH, and the capacitor C may be implemented having a capacitance of about 280 fF. The inductors L1 and L2 are generally implemented as on-chip inductors. The capacitor C may be implement as a metal-insulator-metal (MIM) capacitor. In various embodiments, a layout of the inductors L1 and L2 may be optimized to achieve a highest quality factor (Q) possible. In an example, the inductors L1 and L2 may be configured for a Q of about 14-18 at a desired center frequency.

In various embodiments, the impedance matching circuits 114 and 116 may be designed taking into account extracted parasitic capacitances of the switch circuits 110 and 112. In an example, the impedance matching circuits 114 and 116 may be optimized in part by optimizing the size of the transistors Q1 and Q2 to eliminate the parasitic capacitances. The impedance matching circuits 114 and 116 are generally designed having different impedance values to provide the asymmetry of the T/R switch 100.

In various embodiments, the transistors Q1 and Q2 may be implemented using at least one of a bipolar junction transistor, a metal-oxide-semiconductor (MOS) transistor, a field-effect transistor, or a pseudomorphic high electron mobility transistor (pHEMT). However, the way in which the transistors Q1 and Q2 are connected to implement the switch circuits 110 and 112 generally depends on the particular type of transistors implemented. In an embodiment implementing MOS transistors instead of bipolar transistors, the emitter, base, and collector terminals would be replaced with drain, gate, and source terminals. In various embodiments, the transistors Q1 and Q2 may be implemented using various semiconductor materials (e.g., Si, Ge, GaAs, MOS, SOI CMOS, etc.). In an example, the transistors Q1 and Q2 generally comprise the same number and/or size transistors.

Figure 4:
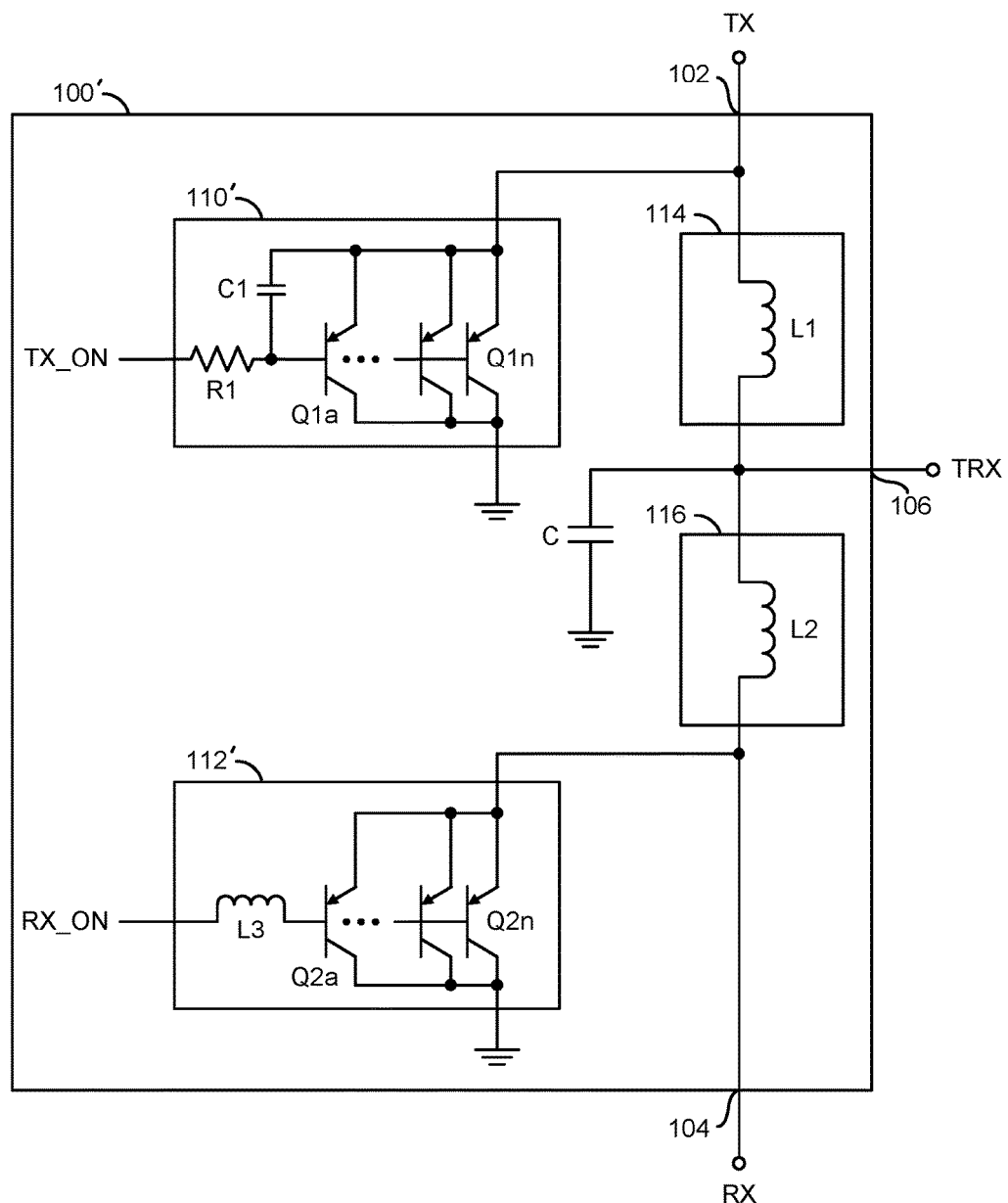
FIG. 4 is a diagram illustrating another example implementation of an asymmetrical T/R switch in accordance with an example embodiment of the invention.

Referring to FIG. 4, a diagram of a circuit 100' is shown illustrating another example implementation of an asymmetrical T/R switch in accordance with an example embodiment of the invention. The circuit 100' may be implemented similarly to the circuit 100 except that the transistors Q1 and Q2 comprise a plurality of transistors connected in parallel. In some embodiments, each of the transistor Q1 and Q2 may be implemented as a number (e.g., N) of transistors connected in parallel. In an example, each of the transistors Q1 and Q2 may be implemented as a plurality of transistors Q1a-Q1n and Q2a-Q2n, respectively, connected in parallel. The transistors Q1 and Q2 generally comprise the same number and/or size of transistors. In an example embodiment using bipolar junction transistors, the transistors Q1 and Q2 may be implemented by connecting six 0.13 μm×8 μm transistors in parallel, where 0.13 μm is the emitter width and 8 μm is the emitter length for each transistor.

Figure 5:
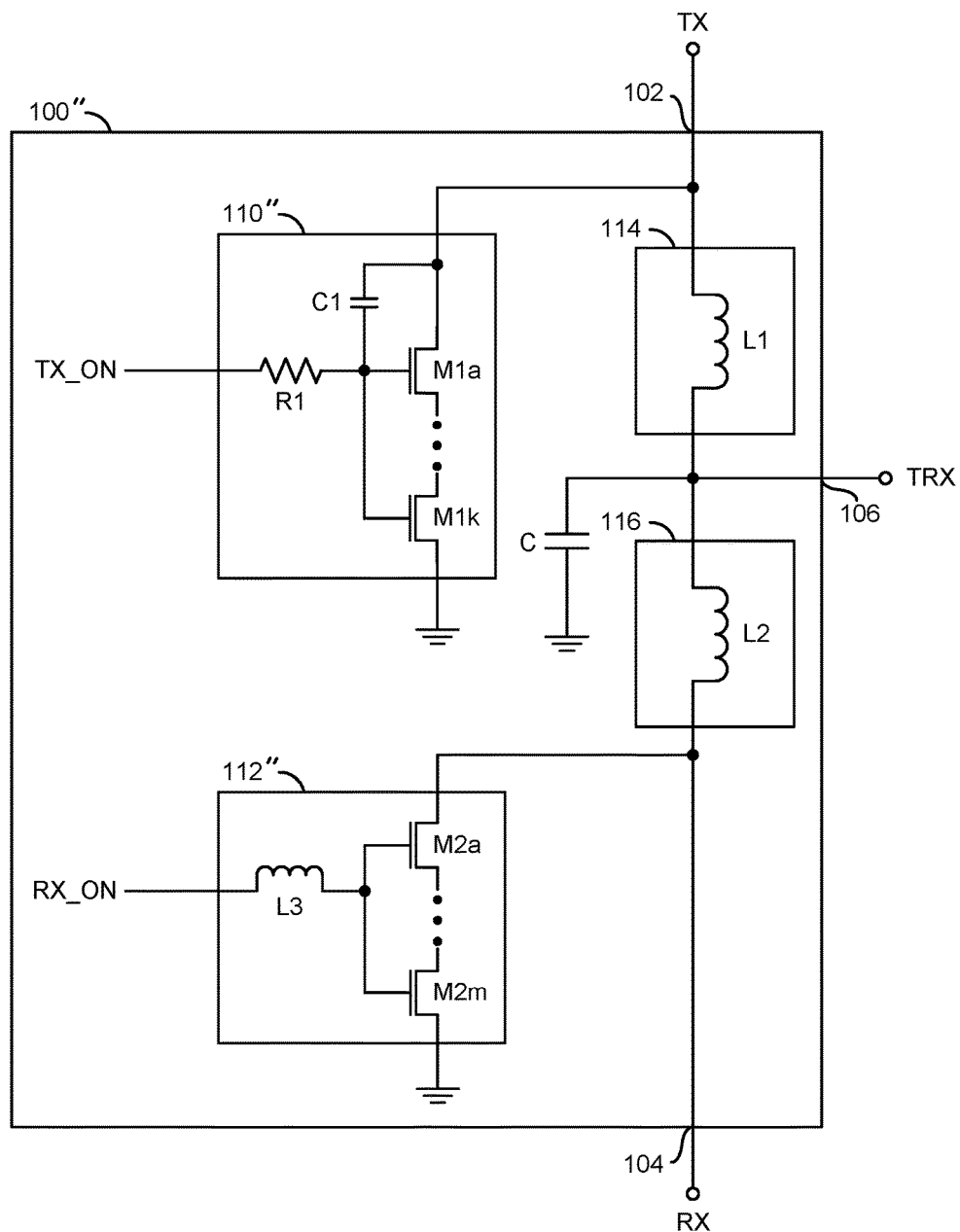
FIG. 5 is a diagram illustrating another example implementation of an asymmetrical T/R switch in accordance with an example embodiment of the invention.

Referring to FIG. 5, a diagram of a circuit 100" is shown illustrating another example implementation of an asymmetrical T/R switch in accordance with an example embodiment of the invention. In some embodiments, the transistor Q1 and Q2 may be implemented using stacked silicon-on-insulator (SOI) complementary metal-oxide-semiconductor (CMOS) transistors. In an example, the circuit 100" may be implemented similarly to the circuit 100 except that the circuit 110 may be replaced with a circuit 110" and the circuit 112 may be replaced with a circuit 112". The circuits 110" and 112" may be similar to the circuits 110 and 112, respectively, except that instead of using bipolar junction transistors, a number of stacked MOS transistors may be used. In some embodiments, the number of stacked MOS transistors is formed using a silicon-on-insulator (SOI) process (e.g., RF SOI, SOI CMOS, etc.). In some embodiments, the number (e.g., K) of stacked MOS transistors in the circuit 110" may be different from the number (e.g., M) of stacked MOS transistors in the circuit 112". In an example, the particular numbers K and M may be determined based upon respective voltage swings of the TX and RX ports.

Figure 6:
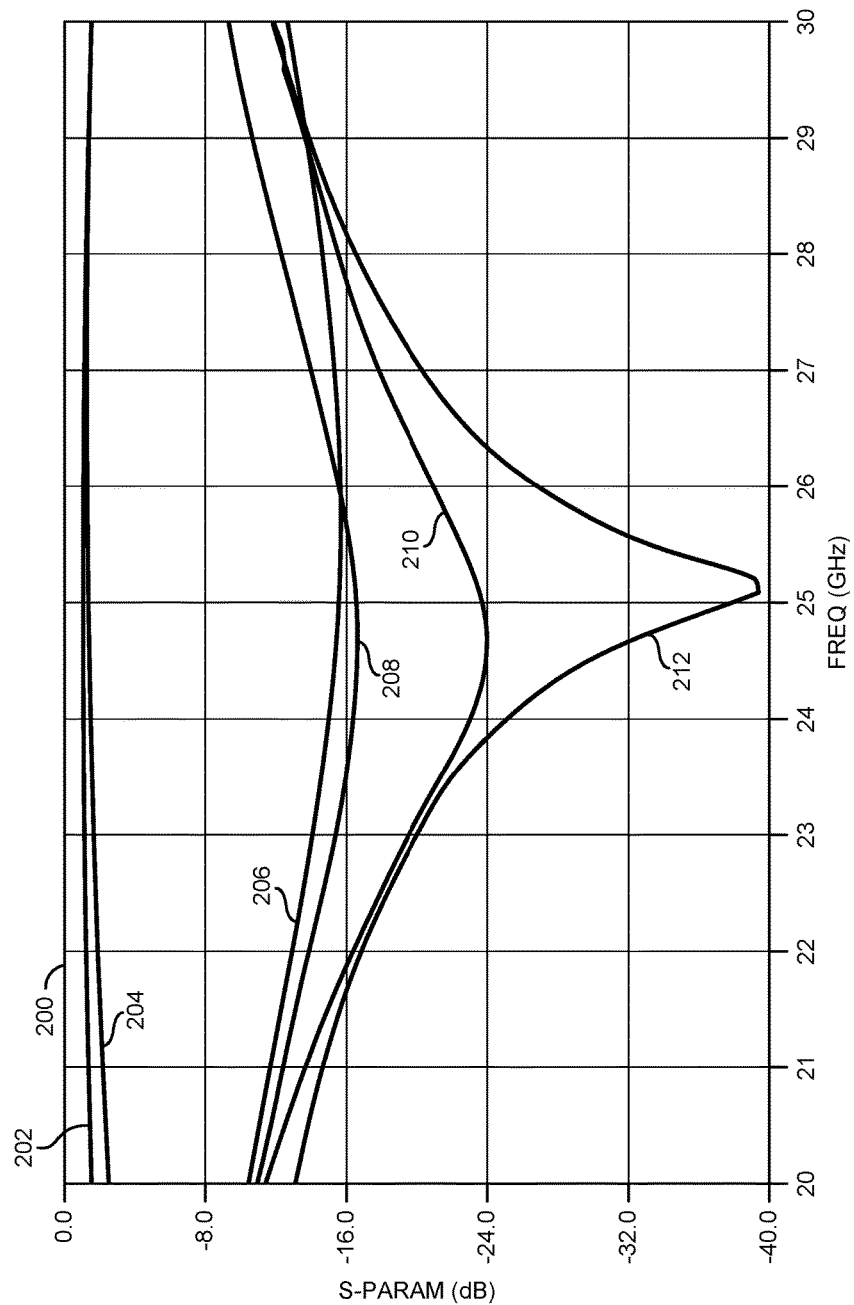
FIG. 6 is a diagram illustrating various s-parameters associated with an asymmetrical T/R switch in accordance with an example embodiment of the invention.

Referring to FIG. 6, a graph 200 comparing S-parameter results vs. frequency is shown illustrating performance of an asymmetrical T/R switch in accordance with an example embodiment of the invention at a center frequency of about 25 GHz. In an example, a number of curves 202, 204, 206, 208, 210, and 212 are shown. The curve 202 generally illustrates the insertion loss in a TX mode (S21). The curve 204 generally illustrates the insertion loss in a RX mode (S65). The curve 206 generally illustrates common port matching in the TX mode (S22). The curve 208 generally illustrates common port matching in the RX mode (S55). The curve 210 generally illustrates RX port matching in the RX mode (S66). The curve 212 generally illustrates TX port matching in the TX mode (S11).

The insertion loss is around 1.6 dB for the RX mode and 1.4 dB for the TX mode. The insertion loss is higher for the RX mode because of the characteristic impedance (Zo(TX)=sqrt(50*25)=35.3 Ohm). When the switch is in the RX mode, the characteristic impedance shows a lower impedance at the common port. Ideally, the characteristic impedance should be infinite due to the 90 degrees transformation from the short. However, the characteristic impedance is not infinite due to the ON resistance of the switch and limited Q of the inductors. Similarly, the insertion loss for the TX mode is lower because of the characteristic impedance (Zo(RX)=sqrt(50*50)=50 Ohm) and this presents a higher impedance at the common port in the TX mode.

The insertion loss of a traditional switch depends on the ON resistance of the switch and Q of the impedance matching network. For bipolar junction transistor based switches at 20-30 GHz, the traditional switch has an insertion loss of 1.5 to 2 dB. Different techniques may be used to improve (reduce) the insertion loss (e.g., high Q inductor design for matching network, increasing the size of the switch to lower the ON resistance, etc.). In the asymmetrical T/R switch topology in accordance with an example embodiment of the invention, the insertion loss is similar to a traditional switch because similar size transistors and similar inductors are used. Therefore, there is no penalty in using the asymmetrical T/R switch topology in accordance with an example embodiment of the invention instead of a traditional switch.

Figure 7:
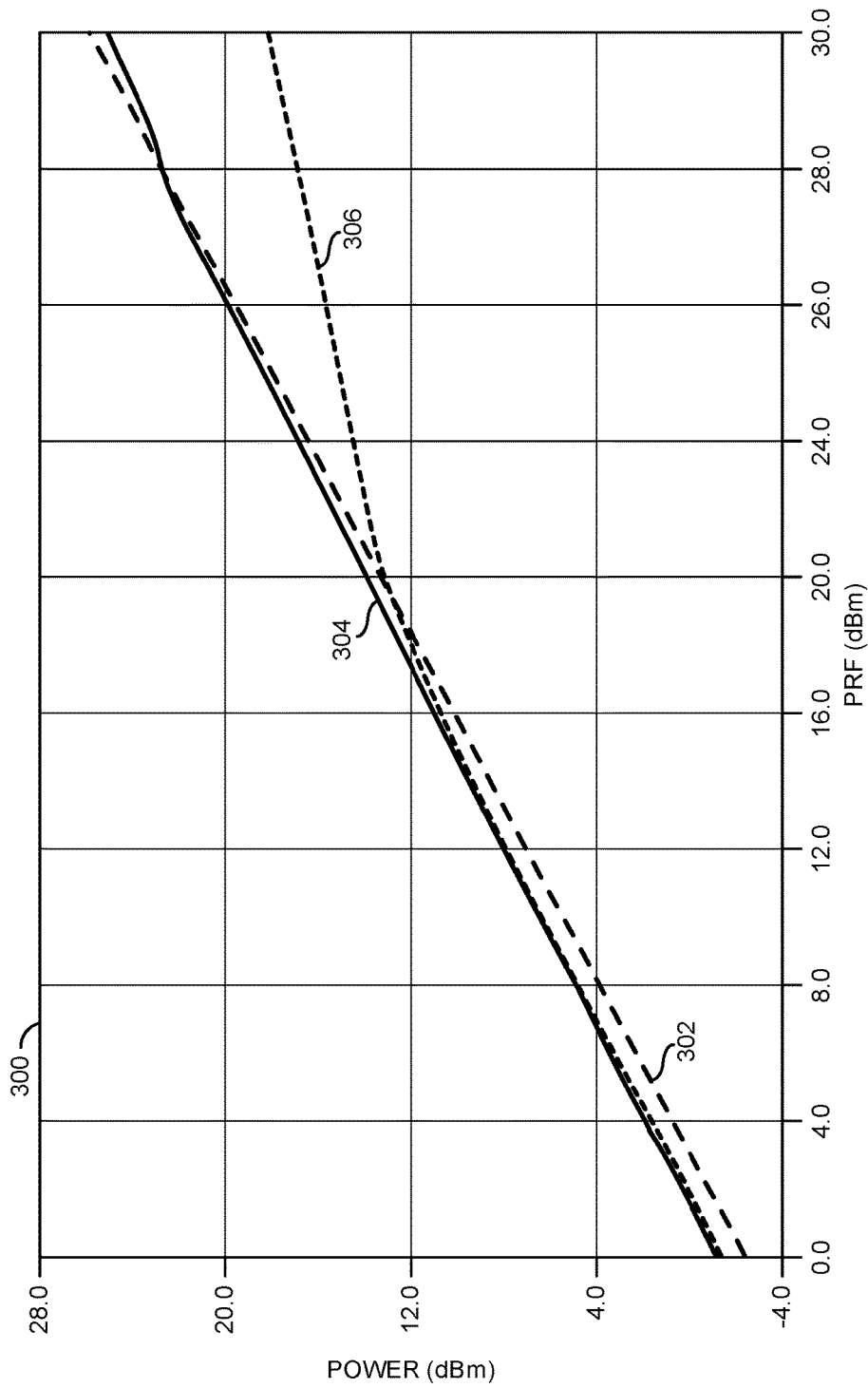
FIG. 7 is a diagram illustrating a transfer function of an asymmetrical T/R switch in accordance with an example embodiment of the invention.

Referring to FIG. 7, a diagram 300 is shown illustrating output power (POWER) at the TRX (common) port with respect to input power (PRF) presented to the TX (input) port. The output power and input power are shown in units of decibel milliwatts (dBm). An amplifier may maintain a constant gain for low-level input signals. However, at higher input levels, the amplifier may go into saturation and the gain decreases. The 1 dB compression point (P1dB) indicates the power level that results in a drop in gain of 1 dB from the small signal gain.

The diagram 300 generally illustrates a comparison between an output referred 1 dB compression point (OP1dB) for an asymmetrical T/R switch in accordance with an example embodiment of the invention and a conventional T/R switch. A linear curve for OP1dB calculation is generally illustrated by a curve 302. A curve 304 illustrates performance of an asymmetrical T/R switch in accordance with an example embodiment of the invention. A curve 306 illustrates performance of a conventional switch. In an example, an OP1dB of about 24 dBm may be achieved using an asymmetrical T/R switch implemented in accordance with an embodiment of the invention. The conventional switch achieves an OP1dB of about 11 dBm. In various embodiments, an asymmetrical T/R switch in accordance with an example embodiment of the invention may provide an improvement over the conventional switch.

In general, there is a trade off between TX linearity and RX insertion loss. Further reduction of the TX port impedance (e.g., $Z_0/4$ rather than $Z_0/2$) may result in further improvement in the linearity at the TX port. However, the insertion loss in the RX mode will degrade too. Higher TX linearity results in higher loss in RX mode. Therefore, an TX port input impedance of $Z_0/2$ is generally selected for optimum TX linearity vs RX insertion loss.

The linearity of the asymmetrical T/R switch topology in accordance with an example embodiment of the invention is much higher than the traditional switch at the TX port only. The same method may be applied in RX port to improve the linearity of the RX mode. However, typical applications generally do not need high power handling in the RX mode. Therefore, the similar technique is not implemented in the RX mode. Instead, the RX mode is generally designed to improve the insertion loss for a lower noise factor (NF). However, the techniques disclosed with respect to the TX port and the RX port may be exchanged or either technique may be used on both ports to meet design criteria of particular applications.

Although embodiments of the invention have been described in the context of a 5G application, the present invention is not limited to 5G applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G) specifications or future specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   an input port;
   an output port;
   a common port;
   a first impedance matching network coupled between said input port and said common port;
   a second impedance matching network coupled between said common port and said output port;
   a first switch circuit coupled between said input port and a circuit ground potential; and
   a second switch circuit coupled between said output port and said circuit ground potential, wherein (i) said first impedance matching network provides a first impedance when said first switch circuit is in a non-conducting state and said second switch circuit is in a conducting state, (ii) said second impedance matching network provides a second impedance when said first switch circuit is in a conducting state and said second switch circuit is in a non-conducting state, and (iii) the first impedance and the second impedance are asymmetrical.

2. The apparatus according to claim 1, wherein an impedance value of said input port is a fraction of an impedance value of said output port and of said common port.

3. The apparatus according to claim 1, wherein:
   said first impedance matching network comprises an impedance matching inductor having a first inductance coupled between said input port and said common port;
   said second impedance matching network comprises a second impedance matching inductor having a second inductance coupled between said output port and said common port; and
   said output port is coupled to said circuit ground potential by a capacitor.

4. The apparatus according to claim 1, wherein:
   an output of a power amplifier of a transceiver transmit chain is coupled to said input port;
   an input of a low noise amplifier of a transceiver receive chain is coupled to said output port;
   in a receive mode, a signal is directed from said common port to said input of said low noise amplifier by placing said first switch circuit in said conducting state to couple said input port to said circuit ground potential and placing said second switch circuit in said non-conducting state; and
   in a transmit mode, a signal is directed from said output of said power amplifier to said common port by placing said first switch circuit in said non-conducting state and placing said second switch circuit in said conducting state to couple said output port to said circuit ground potential.

5. The apparatus according to claim 1, wherein said first switch circuit comprises:
   a transistor configured to operate as a switch;
   a capacitor; and
   a resistor, wherein (i) a first terminal of said resistor is coupled to a base terminal of said transistor, (ii) said capacitor is coupled between an emitter terminal and said base terminal of said transistor, (iii) said emitter terminal of said transistor is coupled to said input port, and (iv) a collector terminal of said transistor is coupled to said circuit ground potential.

6. The apparatus according to claim 5, wherein said capacitor and said resistor are selected to prevent a P-N junction of said transistor from being forward biased due to a signal on said input port.

7. The apparatus according to claim 5, wherein said transistor comprises at least one of a bipolar junction transistor, a metal-oxide-semiconductor (MOS) transistor, a field-effect transistor, or a pseudomorphic high electron mobility transistor (pHEMT).

8. The apparatus according to claim 1, wherein said second switch circuit comprises:
   a transistor configured to operate as a switch; and
   an inductor, wherein (i) a first terminal of said inductor is coupled to a base terminal of said transistor, (ii) an emitter terminal of said transistor is coupled to said output port, and (iii) a collector terminal of said transistor is coupled to said circuit ground potential.

9. The apparatus according to claim 8, wherein said inductor is selected to reduce an insertion loss of a low noise amplifier coupled to said output port.

10. The apparatus according to claim 8, wherein said transistor comprises at least one of a bipolar junction transistor, a metal-oxide-semiconductor (MOS) transistor, a field-effect transistor, or a pseudomorphic high electron mobility transistor (pHEMT).

11. The apparatus according to claim 1, wherein said apparatus comprises a transmit/receive switch on an integrated circuit.

12. The apparatus according to claim 1, wherein said apparatus comprises a reflective transmit/receive switch on an integrated circuit.

13. The apparatus according to claim 1, wherein said apparatus comprises a transceiver circuit on an integrated circuit.

14. The apparatus according to claim 1, wherein said apparatus is configured for a radio frequency (RF) application comprising at least one of a base station, a second generation (2G) wireless communication system, a third generation (3G) wireless communication system, a fourth generation (4G) wireless communication system, a fifth generation (5G) wireless communication system, a wireless backhaul, a repeater, a community antenna television (CATV) network, a macro cell, a micro cell, a pico cell, a femto cell, a mobile device, and a portable handheld device.

15. A method to switch an antenna between a transceiver transmit chain and a transceiver receive chain, the method comprising:
   coupling an output of said transceiver transmit chain to said antenna using a first impedance matching network having a first characteristic impedance value and coupling an input of the transceiver receive chain to said antenna using a second impedance matching network having a second characteristic impedance value, wherein said first and said second characteristic impedance values are asymmetrical;
   in a receive mode, coupling said output of said transceiver transmit chain to a circuit ground potential using a first switch circuit; and
   in a transmit mode, coupling said input of said transceiver receive chain to said ground potential using a second switch circuit.

16. The method according to claim 15, wherein said first characteristic impedance value of said first impedance network is a fraction of said second characteristic impedance value of said second impedance network.

17. The method according to claim 15, wherein said first switch circuit comprises:
- a transistor configured to operate as a switch;
- a capacitor; and
- a resistor, wherein (i) a first terminal of said resistor is coupled to a base terminal of said transistor, (ii) said capacitor is coupled between an emitter terminal and said base terminal of said transistor, (iii) said emitter terminal of said transistor is coupled to said input port, and (iv) a collector terminal of said transistor is coupled to said circuit ground potential.

18. The method according to claim 15, wherein said second switch circuit comprises:
- a transistor configured to operate as a switch; and
- an inductor, wherein (i) a first terminal of said inductor is coupled to a base terminal of said transistor, (ii) an emitter terminal of said transistor is coupled to said output port, and (iii) a collector terminal of said transistor is coupled to said circuit ground potential.

19. The method according to claim 18, wherein said inductor is selected to reduce an insertion loss of a low noise amplifier of said transceiver receive chain.

20. The method according to claim 15, wherein said first and said second switch circuits comprise at least one of a bipolar junction transistor, a metal-oxide-semiconductor (MOS) transistor, a field-effect transistor, or a pseudomorphic high electron mobility transistor (pHEMT).

* * * * *